(12) United States Patent
Furuie

(10) Patent No.: US 11,349,098 B2
(45) Date of Patent: May 31, 2022

(54) DISPLAY DEVICE WITH AN IMPROVED SEALING LAYER

(71) Applicant: Japan Display Inc., Tokyo (JP)

(72) Inventor: Masamitsu Furuie, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/942,934

(22) Filed: Jul. 30, 2020

(65) Prior Publication Data

US 2020/0381663 A1    Dec. 3, 2020

Related U.S. Application Data

(63) Continuation of application No. PCT/JP2018/042123, filed on Nov. 14, 2018.

(30) Foreign Application Priority Data

Feb. 7, 2018    (JP) .............................. JP2018-020264

(51) Int. Cl.
| | | |
|---|---|---|
| *H01L 29/18* | (2006.01) | |
| *H01L 51/52* | (2006.01) | |
| *H01L 51/56* | (2006.01) | |
| *H01L 27/32* | (2006.01) | |

(52) U.S. Cl.
CPC .......... *H01L 51/5253* (2013.01); *H01L 51/56* (2013.01); *H01L 27/3244* (2013.01)

(58) Field of Classification Search
CPC ............................ H01L 51/5253; H01L 51/56
See application file for complete search history.

(56) References Cited

U.S. PATENT DOCUMENTS

| | | | |
|---|---|---|---|
| 10,026,625 B2 * | 7/2018 | Schmid | ............. C23C 16/45525 |
| 10,622,587 B2 * | 4/2020 | Hong | .................. H01L 51/5256 |

(Continued)

FOREIGN PATENT DOCUMENTS

| | | |
|---|---|---|
| JP | 2014-123727 A | 7/2014 |
| JP | 2014-179278 A | 9/2014 |

(Continued)

OTHER PUBLICATIONS

International Search Report dated Dec. 11, 2018 for the corresponding PCT Application No. PCT/JP2018/042123, with English translation.

(Continued)

*Primary Examiner* — Caleb E Henry
(74) *Attorney, Agent, or Firm* — Michael Best & Friedrich LLP

(57) ABSTRACT

A display device according to an embodiment of the present invention includes: a substrate having a display region for displaying an image; a plurality of pixels located in the display region of the substrate; and a sealing layer covering the plurality of pixels, wherein the sealing layer includes a first inorganic material film, a second inorganic material film, a resin material layer, and a third inorganic material film in this order from the side where the pixels are arranged, and the second inorganic material film is in contact with the resin material layer, has a composition different from that of the first inorganic material film, and has a higher oxygen content than the first inorganic material film.

13 Claims, 8 Drawing Sheets

(56) References Cited

U.S. PATENT DOCUMENTS

| | | | |
|---|---|---|---|
| 2007/0170423 A1* | 7/2007 | Choi | C03C 17/40 257/40 |
| 2012/0068169 A1* | 3/2012 | Hirase | H05B 33/04 257/40 |
| 2014/0117569 A1* | 5/2014 | Schmid | H01L 21/56 257/790 |
| 2014/0179041 A1 | 6/2014 | Huh et al. | |
| 2014/0183478 A1* | 7/2014 | Lee | H01L 51/0097 257/40 |
| 2014/0264300 A1 | 9/2014 | Kamiya | |
| 2015/0380682 A1 | 12/2015 | Kamiya | |
| 2016/0043151 A1 | 2/2016 | Kato | |
| 2016/0095172 A1* | 3/2016 | Lee | C23C 16/401 313/504 |
| 2016/0322604 A1* | 11/2016 | Ho | H01L 51/56 |
| 2017/0047384 A1 | 2/2017 | Kamiya | |
| 2017/0047549 A1 | 2/2017 | Kamiya | |
| 2017/0117337 A1* | 4/2017 | Kimura | H01L 51/56 |
| 2017/0133629 A1 | 5/2017 | Kato | |
| 2017/0155086 A1* | 6/2017 | Kang | H01L 27/3262 |
| 2017/0213976 A1* | 7/2017 | Luo | H01L 51/56 |
| 2017/0271619 A1* | 9/2017 | Sumita | H01L 51/5256 |
| 2017/0309863 A1 | 10/2017 | Kato | |
| 2018/0047939 A1 | 2/2018 | Kamiya | |
| 2018/0061900 A1* | 3/2018 | Hiraga | H01L 27/124 |
| 2018/0145281 A1 | 5/2018 | Kato | |
| 2018/0233700 A1* | 8/2018 | Li | H01L 51/5246 |
| 2019/0131567 A1* | 5/2019 | Li | H01L 51/56 |
| 2019/0288237 A1 | 9/2019 | Kamiya | |

FOREIGN PATENT DOCUMENTS

| | | |
|---|---|---|
| JP | 2015-176717 A | 10/2015 |
| JP | 2016-039070 A | 3/2016 |
| JP | 2017-174641 A | 9/2017 |
| JP | 2018-014200 A | 1/2018 |

OTHER PUBLICATIONS

Japanese Office Action dated Aug. 17, 2021 for the corresponding JP Application No. 2018-020264, with computer generated English translation.

* cited by examiner

DISPLAY DEVICE WITH AN IMPROVED SEALING LAYER

CROSS-REFERENCE TO RELATED APPLICATION

This application is a continuation under 35 U.S.C. 120 of International Application PCT/JP2018/042123 having the International Filing Date of Nov. 14, 2018, and having the benefit of the earlier filing date of Japanese Application No. 2018-020264, filed on Feb. 7, 2018. Each of the identified applications is fully incorporated herein by reference.

BACKGROUND OF THE INVENTION

1. Field of the Invention

One or more embodiments of the present invention relate to an organic EL display device.

2. Description of the Related Art

In recent years, an image display device (hereinafter, referred to as an "organic electro-luminescent (EL) display device") using a self-luminous body called an organic light emitting diode (OLED) has been put into practical use. The organic EL display device uses a self-luminous body, for example, as compared with a liquid crystal display device, and thus is not only excellent in visibility and response speed, but also does not require a lighting device such as a backlight. Therefore, it is possible to reduce the thickness.

The organic EL display device includes a display panel in which a thin film transistor (TFT), an organic light emitting diode (OLED), and the like are formed on a base material. In such an organic EL display device, a method of sealing a display region including a light emitting element is adopted to protect the light emitting element from moisture and the like. As a sealing method, for example, a method of combining an inorganic material film and a resin material layer is used as disclosed in JP 2015-176717 A.

SUMMARY OF THE INVENTION

However, the adhesiveness between the inorganic material film and the resin material layer is low, which may lead to a decrease in mechanical strength.

One or more embodiments of the present invention have been made in view of the above, an object thereof is to provide an organic EL display device having excellent mechanical strength.

A display device according to an embodiment of the present invention includes: a substrate having a display region for displaying an image; a plurality of pixels located in the display region of the substrate; and a sealing layer covering the plurality of pixels, wherein the sealing layer includes a first inorganic material film, a second inorganic material film, a resin material layer, and a third inorganic material film in this order from the side where the pixels are arranged, and the second inorganic material film is in contact with the resin material layer, has a composition different from that of the first inorganic material film, and has a higher oxygen content than the first inorganic material film.

DETAILED DESCRIPTION OF THE INVENTION

Figure 1:
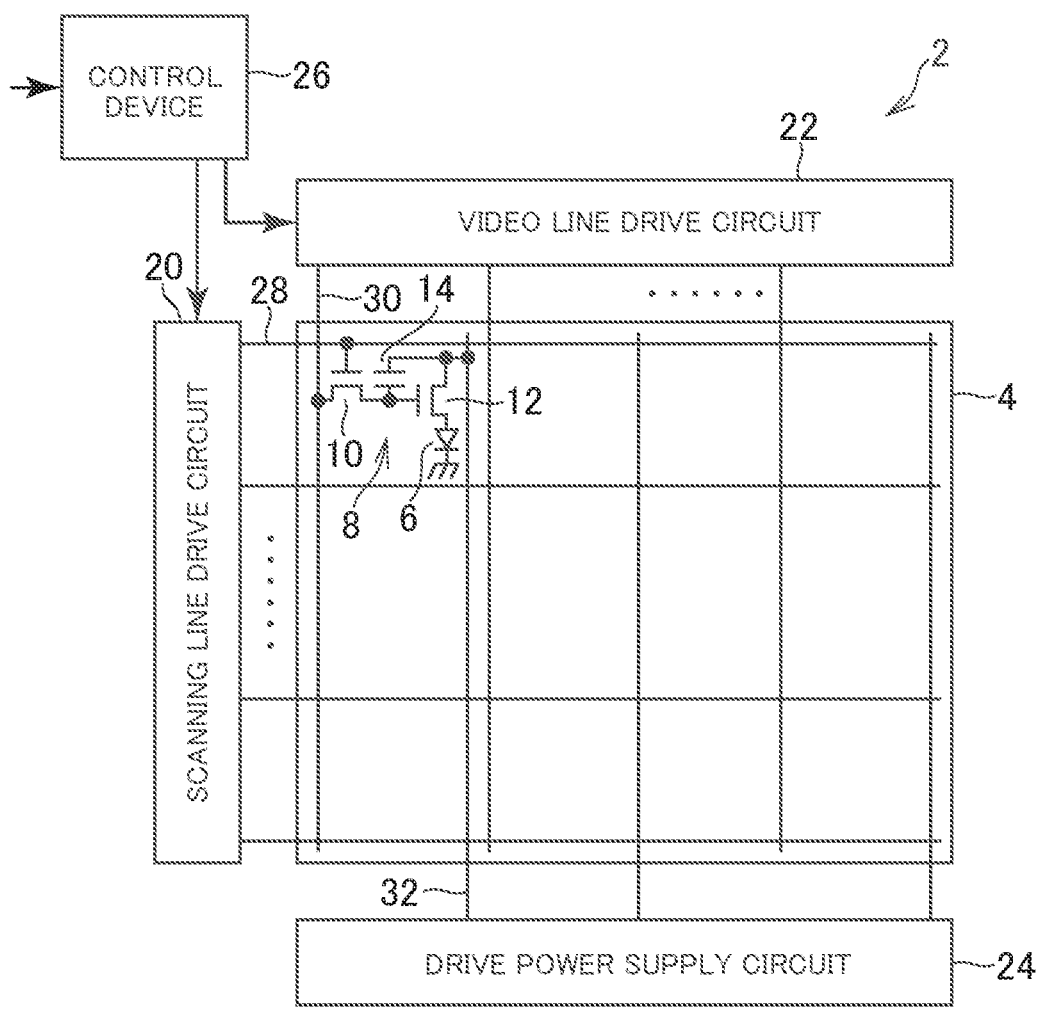
FIG. 1 is a schematic diagram showing a schematic configuration of an organic EL display device according to one embodiment of the present invention.

Hereinafter, embodiments of the present invention will be described with reference to the drawings. It should be noted that the disclosure is merely an example, and those skilled in the art will understand that the appropriate modifications that can be easily conceived while keeping the gist of the invention are naturally included in the scope of the invention. In order to make the description clearer, the drawings may be schematically evaluated in terms of the width, thickness, shape, and the like of each unit as compared with the actual ones, but they are merely examples and are not intended to limit the interpretation of the present invention. In the present specification and each drawing, the same elements as those described previously with reference to the already-existing drawings are denoted by the same reference numerals, and the detailed description thereof may be appropriately omitted.

In the detailed description of the present invention, when defining the positional relationship between a certain component and another component, the terms "above" and "below" include not only the case where located directly above or below the certain component, but also the case where other components are further interposed therebetween unless otherwise specified.

FIG. 1 is a schematic diagram showing a schematic configuration of a display device according to one embodiment of the present invention, taking an organic EL display device as an example. An organic EL display device 2 includes a pixel array unit 4 that displays an image and a drive unit that drives the pixel array unit 4. The organic EL display device 2 is configured by forming a stacked structure such as a thin film transistor (TFT) or an organic light emitting diode (OLED) on a base material. The schematic diagram shown in FIG. 1 is an example and the present embodiment is not limited thereto.

In the pixel array unit 4, pixels each having a pixel circuit 8 and an OLED 6 are arranged in a matrix. The pixel circuit 8 is configured of a plurality of TFTs 10 and 12 and a capacitor 14.

The drive unit includes a scanning line drive circuit 20, a video line drive circuit 22, a drive power supply circuit 24, and a control device 26, and drives the pixel circuit 8 to control the light emission of the OLED 6.

The scanning line drive circuit 20 is connected to a scanning signal line 28 provided for each horizontal alignment (pixel row) of pixels. The scanning line drive circuit 20 sequentially selects the scanning signal lines 28 according to the timing signal input from the control device 26 and applies a voltage for turning on the switching TFT 10 to the selected scanning signal lines 28.

The video line drive circuit 22 is connected to a video signal line 30 provided for each vertical alignment (pixel column) of pixels. The video line drive circuit 22 receives a video signal from the control device 26 and outputs a voltage corresponding to the video signal of the selected pixel row to each video signal line 30 according to the selection of the scanning signal line 28 by the scanning line drive circuit 20. The voltage is written in the capacitor 14 via the switching TFT 10 in the selected pixel row. The drive TFT 12 supplies the OLED 6 with a current corresponding to the written voltage, whereby the OLED 6 of the pixel corresponding to the selected scanning signal line 28 emits light.

The drive power supply circuit 24 is connected to a drive power supply line 32 provided for each pixel column and supplies a current to the OLED 6 via the drive power supply line 32 and the drive TFT 12 of the selected pixel row. Although the drive power supply line 32 is provided for each pixel column in FIG. 1, the drive power supply line 32 may be provided for each pixel row or both of the pixel column and the pixel row.

Here, the lower electrode of the OLED 6 is connected to the drive TFT 12. On the other hand, the upper electrode of each OLED 6 is an electrode common to the OLEDs 6 of all pixels. When the lower electrode is configured as an anode, a high potential is input, and the upper electrode serves as a cathode in which a low potential is input thereto. When the lower electrode is configured as a cathode, a low potential is input, and the upper electrode serves as an anode in which a high potential is input.

Figure 2:
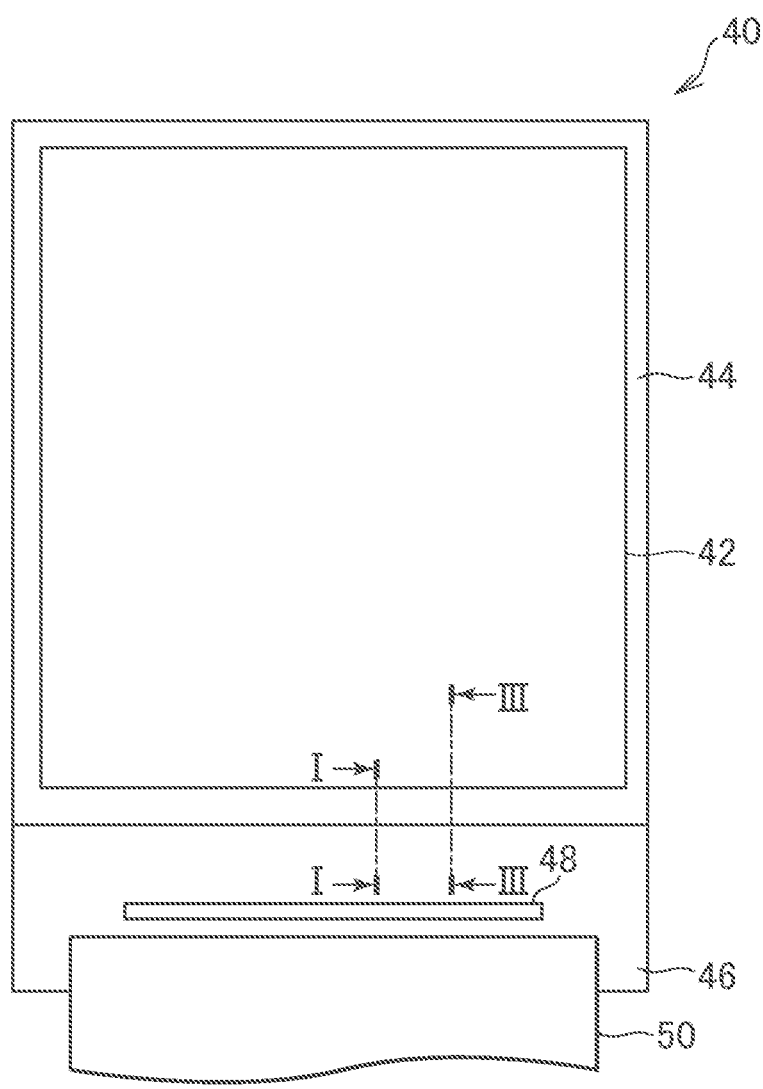
FIG. 2 is a schematic plan view showing an example of a display panel of the organic EL display device shown in FIG. 1.

FIG. 2 is a schematic plan view showing an example of a display panel of the organic EL display device shown in FIG. 1. A display region 42 of a display panel 40 is provided with the pixel array unit 4 shown in FIG. 1, and the OLEDs 6 are arranged in the pixel array unit 4 as described above. As described above, the upper electrode forming the OLED 6 is formed commonly to each pixel and covers the entire display region 42. A frame region 44 is provided around the display region 42, and the scanning line drive circuit 20, the video line drive circuit 22, the drive power supply circuit 24, the control device 26, and the like described above are provided.

On one side of the frame region 44 of the rectangular display panel 40, a component mounting region 46 is provided and wirings connected to the display region 42 are arranged. In the component mounting region 46, a driver IC 48 that constitutes a drive unit is mounted or a flexible printed circuit board (FPC) 50 is connected. The FPC 50 is connected to the control device 26 and other circuits 20, 22, 24, and the like, or has an IC mounted thereon.

Figure 3:
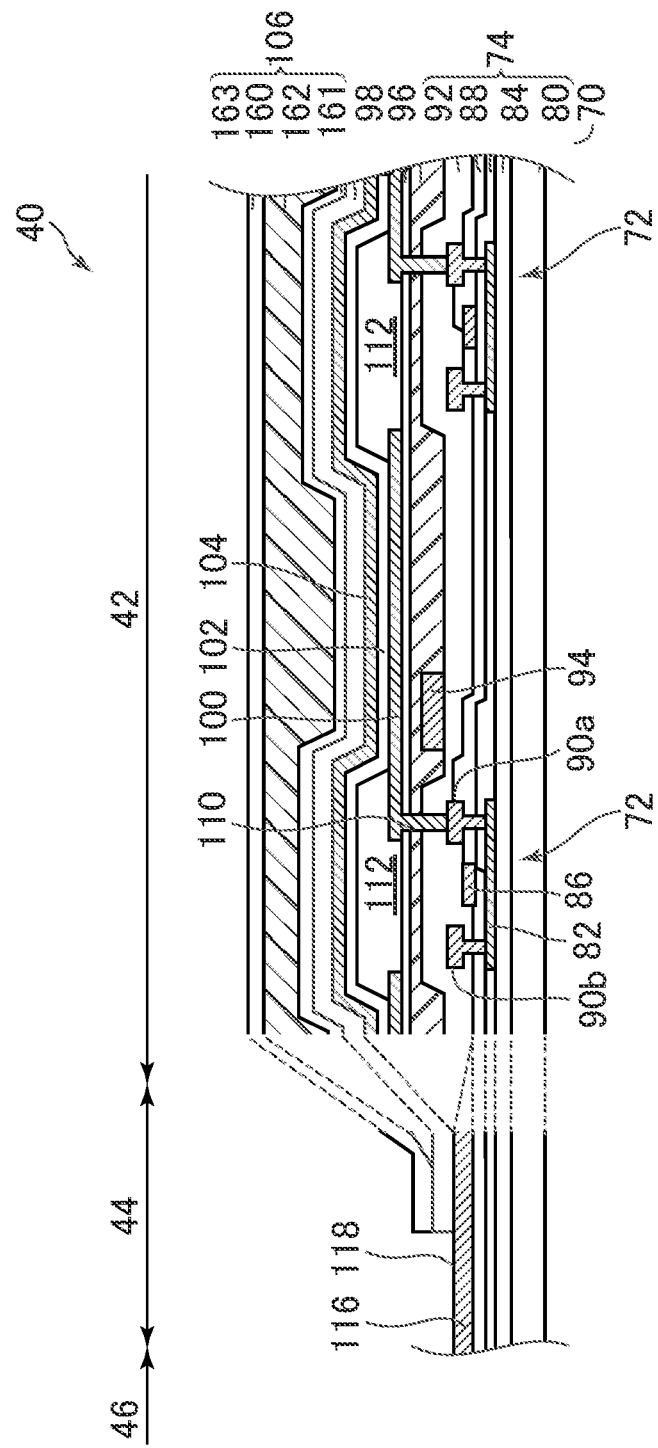
FIG. 3 is a schematic diagram showing an example of a cross section taken along line III-III in FIG. 2.

FIG. 3 is a schematic diagram showing an example of a cross section taken along line III-III in FIG. 2. In FIG. 3, hatching of some layers is omitted in order to make the sectional structure easy to see.

The display panel 40 has, for example, a structure in which a circuit layer 74 having a TFT 72 and the like formed thereon, the OLED 6, and a sealing layer 106 for sealing the OLED 6 and the like are stacked on a base material 70. The base material 70 is formed of, for example, a transparent substrate such as glass or quartz, or a resin film including a resin such as a polyimide resin. When the base material 70 is formed of a resin film, the base material 70 is formed by, for example, applying a resin material to form a film on a supporting substrate (not shown), and flexibility is imparted by exfoliating the supporting substrate later. For example, a protective layer (not shown) is arranged on the sealing layer 106. In the present embodiment, the pixel array unit 4 is of a top emission type, and the light generated by the OLED 6 is emitted to the side opposite to the base material 70 side (upward in FIG. 3). When the colorization method in the organic EL display device 2 is the color filter method, for example, a color filter is arranged between the sealing layer 106 and the protective layer (not shown) or on a counter substrate (not shown) side. For example, red (R), green (G), and blue (B) light is produced by passing white light generated by the OLED 6 through the color filter.

The pixel circuit 8, the scanning signal line 28, the video signal line 30, the drive power supply line 32, and the like described above are formed on the circuit layer 74 of the display region 42. At least a portion of the drive unit can be formed on the base material 70 as the circuit layer 74 in a region adjacent to the display region 42. The terminals of the driver IC 48 that constitutes the drive unit and the FPC 50 are electrically connected to a wiring 116 of the circuit layer 74 in the component mounting region 46.

As shown in FIG. 3, a base layer 80 formed of an inorganic insulating material is arranged on the base material 70. As the inorganic insulating material, for example, silicon nitride ($SiN_y$), silicon oxide ($SiO_x$), and a complex thereof are used.

In the display region 42, a semiconductor region 82 serving as a channel portion and a source/drain portion of the top gate type TFT 72 is formed on the base material 70 via the base layer 80. The semiconductor region 82 is formed of, for example, polysilicon (p-Si). The semiconductor region 82 is formed, for example, by providing a semiconductor layer (p-Si film) on the base material 70, patterning the semiconductor layer, and selectively leaving a portion used for the circuit layer 74.

A gate electrode 86 is arranged on the channel portion of the TFT 72 with a gate insulating film 84 interposed therebetween. The gate insulating film 84 is typically formed of TEOS. The gate electrode 86 is formed, for example, by patterning a metal film formed by sputtering or the like. An interlayer insulating layer 88 is arranged on the gate electrode 86 to cover the gate electrode 86. The interlayer insulating layer 88 is formed of, for example, the above-mentioned inorganic insulating material. An impurity is introduced by ion implantation into the semiconductor region 82 (p-Si) serving as the source/drain portion of the TFT 72, and a source electrode 90a and a drain electrode 90b that are electrically connected to the source/drain portion are formed to form the TFT 72.

An interlayer insulating film 92 is arranged on the TFT 72. A wiring 94 is arranged on the surface of the interlayer insulating film 92. The wiring 94 is formed, for example, by patterning a metal film formed by sputtering or the like. With the metal film forming the wiring 94 and the metal film used for forming the gate electrode 86, the source electrode 90a, and the drain electrode 90b, for example, a wiring 116 and the scanning signal line 28, the video signal line 30, and the drive power supply line 32 shown in FIG. 1 can be formed to have a multilayer wiring structure. A planarizing film 96 and a passivation film 98 are formed thereon, and the OLED 6 is formed on the passivation film 98 in the display region 42. The planarizing film 96 is formed of, for example, a resin material. The passivation film 98 is formed of, for example, an inorganic insulating material such as $SiN_y$.

The OLED 6 includes a lower electrode 100, an organic material layer 102, and an upper electrode 104. The OLED 6 is typically formed by stacking the lower electrode 100, the organic material layer 102, and the upper electrode 104 in this order from the base material 70 side. In the present embodiment, the lower electrode 100 is the anode of the OLED 6 and the upper electrode 104 is the cathode.

If the TFT 72 shown in FIG. 3 is the drive TFT 12 having an n-channel, the lower electrode 100 is connected to the source electrode 90a of the TFT 72. Specifically, after forming the above-described planarizing film 96, a contact hole 110 for connecting the lower electrode 100 to the TFT 72 is formed. For example, by patterning the conductor portion formed on the surface of the planarizing film 96 and in the contact hole 110, the lower electrode 100 connected to the TFT 72 is formed for each pixel. The lower electrode 100 is formed of, for example, a transparent metal oxide such as indium tin oxide (ITO) and indium zinc oxide (IZO), and a metal such as Ag and Al.

A bank 112 for separating pixels is arranged on the above-described structure. For example, after forming the lower electrode 100, the bank 112 is formed at the pixel boundary, and the organic material layer 102 and the upper electrode 104 are stacked in the valid region of the pixel surrounded by the bank 112 (the region where the lower electrode 100 is exposed). The organic material layer 102 is typically formed by stacking a hole transport layer, a light emitting layer, and an electron transport layer in this order from the anode side. The organic material layer 102 can have other layers. Examples of the other layers include a hole injection layer and an electron blocking layer arranged between the anode and the light emitting layer, and an electron injection layer and a hole blocking layer arranged between the cathode and the light emitting layer. The organic material layer 102 may be continuously formed on the plurality of lower electrodes 100 and banks 112 as shown in FIG. 3 or may be selectively formed on each lower electrode 100. Although the organic material layer 102 may have a plurality of layers as described above, some layers may be continuously formed over the plurality of lower electrodes 100 and banks 112, and some other layers may be selectively formed on each lower electrode 100.

The upper electrode 104 is constituted of a transparent conductive film. The transparent conductive film is formed of, for example, a metal (for example, an ultrathin alloy of Mg and Ag) or a transparent metal oxide such as ITO or IZO.

The sealing layer 106 is arranged on the upper electrode 104 to cover the entire display region 42. On the other hand, the sealing layer 106 is not arranged in the component mounting region 46. On the outside of the sealing layer 106, a terminal portion 118 in which the wiring 116 is exposed is formed. Although not shown, for example, in order to secure the mechanical strength of the surface of the display panel 40, a protective layer is arranged on the surface of the display region 42. Specifically, a sheet-shaped or film-shaped protective layer is attached to the sealing layer 106 with an adhesion layer interposed therebetween. Here, the component mounting region 46 is usually not provided with a protective layer in order to easily connect an IC or FPC.

The sealing layer 106 has a stacked structure including a first inorganic material film 161, a second inorganic material film 162, a resin material layer 160, and a third inorganic material film 163 in this order. The first inorganic material film 161 is formed, for example, by forming a $SiN_y$ film by a chemical vapor deposition (CVD) method. The thickness of the first inorganic material film 161 is, for example, about 1 μm. The resin material layer 160 is formed of, for example, an acrylic or epoxy-based resin material. The resin material layer 160 is formed, for example, by applying a curable resin composition by any appropriate method such as an inkjet method or a screen printing method and curing the obtained applied layer. The thickness of the resin material layer 160 is, for example, about 10 μm. Similar to the first inorganic material film 161, the third inorganic material film 163 is formed by depositing a $SiN_y$ film by the CVD method. The thickness of the third inorganic material film 161 is, for example, about 1 μm.

The second inorganic material film 162 has a composition different from that of the first inorganic material film 161. In one embodiment, the second inorganic material film 162 has a higher oxygen element content than the first inorganic material film 161. Specifically, when the first inorganic material film 161 includes $SiN_y$ as a main component, the second inorganic material film 162 includes $SiO_x$ as a main component. By arranging such a second inorganic material film 162, a bond is generated on the surface of the resin material layer 160, and the adhesiveness between the resin material layer 160 and the inorganic material film can be improved. As a result, the mechanical strength can be improved. As a bond that may occur on the surface of the resin material layer 160, a hydrogen bond between a hydroxyl group and an oxygen atom is typically included. In addition, for example, a bond may occur between an organic group included in the resin material layer 160 and an oxygen atom and/or a hydroxyl group on the surface of the second inorganic material film. Here, the organic group included in the resin material layer 160 may be derived from the curing agent included in the resin composition forming the resin material layer 160. As a specific example, an ionic bond between an amino group included in the resin material layer 160 (for example, an epoxy-based resin) and a hydroxyl group of the second inorganic material film, and an alkoxy bond generated between the resin material layer 160 (for example, an epoxy-based resin) and a hydroxyl group of the second inorganic material film.

The effect of improving the adhesiveness by the second inorganic material film 162 can be remarkably achieved by arranging the second inorganic material film 162 between the first inorganic material film 161 and the resin material layer 160 arranged on the base material 70 side. The second inorganic material film 162 may be arranged on at least a part of the upper surface of the first inorganic material film 161, for example. For example, from the viewpoint of reducing the influence on the display characteristics, the second inorganic material film 162 is evenly arranged at least in the display region 42.

The thickness of the second inorganic material film 162 is, for example, about 0.1 μm. The thickness of the second inorganic material film 162 can be set to, for example, 1/50 to 1/5 of the thickness of the first inorganic material film 161. The surface of the second inorganic material film 162 (the surface on the side where the resin material layer 160 is arranged) may be smooth (the film thickness is uniform) or may be in the state of being provided with unevenness (the film thickness is not uniform). By providing the surface with unevenness, the contact area with the resin material layer 160 increases and the adhesiveness can be further improved. The second inorganic material film 162 is formed by, for example, the CVD method. The second inorganic material film 162 having an uneven surface is formed, for example, by forming a film by the CVD method through a mesh-shaped mask. When, for example, the surface unevenness affects the display characteristics of the display panel 40, the unevenness may be selectively formed in the region surrounding the display region 42 (frame region 44).

Figure 4:
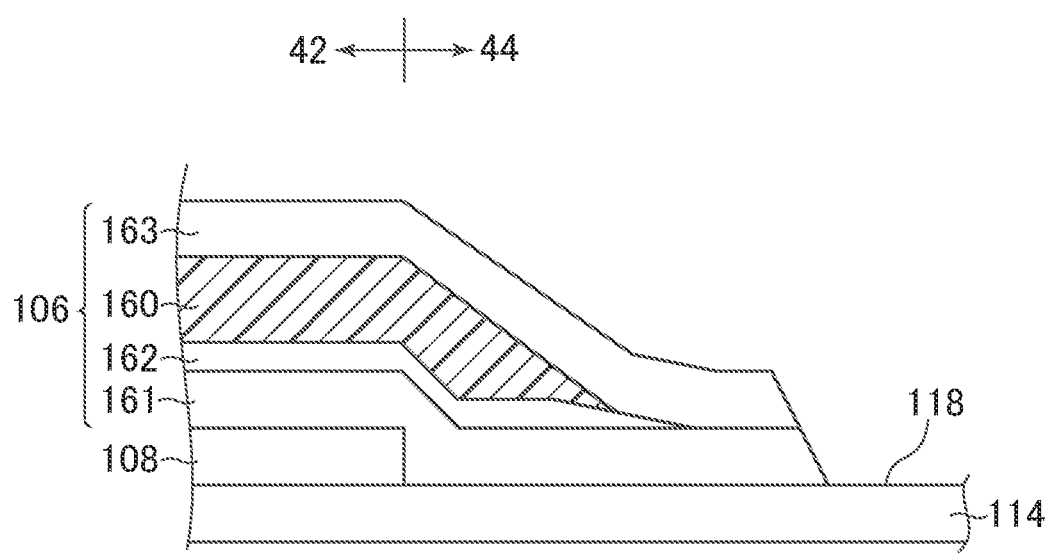
FIG. 4 is a schematic diagram showing an example of a cross section taken along line I-I in FIG. 2.

FIG. 4 is a schematic view showing an example of the cross section taken along line I-I in FIG. 2 and is an enlarged view showing an example of the boundary portion between the display region 42 and the frame region 44. The frame region 44 is a region that surrounds the display region 42 and differs from the display region 42 in that, for example, the OLED 6 is not included. In FIG. 4, the layer from the base material 70 to the wiring 116 shown in FIG. 3 is simplified as a substrate 114, and the structure arranged from the interlayer insulating film 92 to below the sealing layer 106 is simplified as a lower structural layer 108.

As shown in FIG. 4, for example, from the viewpoint of preventing moisture from entering the sealing layer 106, the upper surface and the end surface of the resin material layer 160 are covered with the third inorganic material film 163. The resin material layer 160 does not exist at the end portion of the sealing layer 106, and the first inorganic material film ($SiN_y$ film) 161 and the third inorganic material film ($SiN_y$ film) 163 are in direct contact with each other. The end portion of the second inorganic material film ($SiO_x$ film) 162 extends outward from the resin material layer 160, and the contact between the resin material layer 160 and the first inorganic material film 161 is reduced. Therefore, the adhesiveness is improved even in the end portion of the sealing layer 106.

The end portion of the second inorganic material film 162 (extension portion extending outward from the resin material layer 160) is covered with the third inorganic material film 163, and the second inorganic material film 162 is housed inside the sealing layer 106 and is not exposed on the surface of the sealing layer 106. With such a configuration, it is possible to prevent moisture from entering the sealing layer 106, for example.

The slope of the end surface (end surface of the sealing layer 106) of the stacked portion in which the first inorganic material film 161 and the third inorganic material film 163 are stacked in direct contact with each other is steeper than the slope of the end surface of the second inorganic material film 162.

FIGS. 5A to 5G are diagrams showing an example of a manufacturing process of the organic EL display device according to the embodiment. In FIGS. 5A to 5G, the layer from the base material 70 to the wiring 116 shown in FIG. 3 is simplified as the substrate 114, and the structure arranged from the interlayer insulating film 92 to below the sealing layer 106 is simplified as the lower structural layer 108.

Figure 5A:
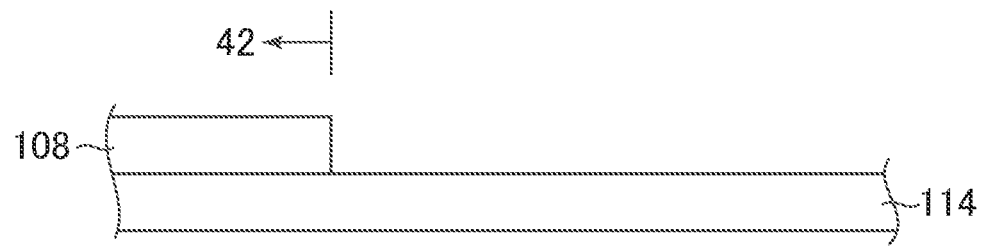
FIG. 5A is a diagram showing an example of a manufacturing process of the organic EL display device according to the embodiment.
Figure 5B:
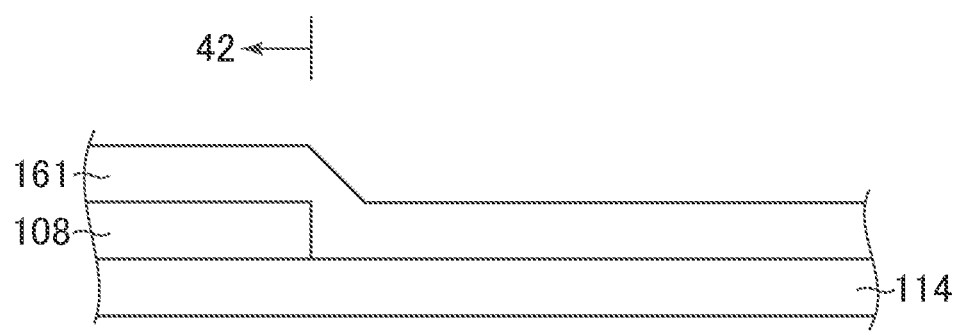
FIG. 5B is a diagram showing an example of the manufacturing process of the organic EL display device according to the embodiment.

FIG. 5A shows a state where the formation of the lower structure layer 108 including up to the OLED 6 on the substrate 114 (base material 70) is completed. Next, as shown in FIG. 5B, the first inorganic material film 161 is formed by the CVD method to cover the entire display region 42 of the substrate 114. Here, a mask material for masking not to form the first inorganic material film 161 in a predetermined region is not arranged. Therefore, the first inorganic material film 161 is also formed in a position where the terminal portion 118 will be formed later.

Figure 5C:
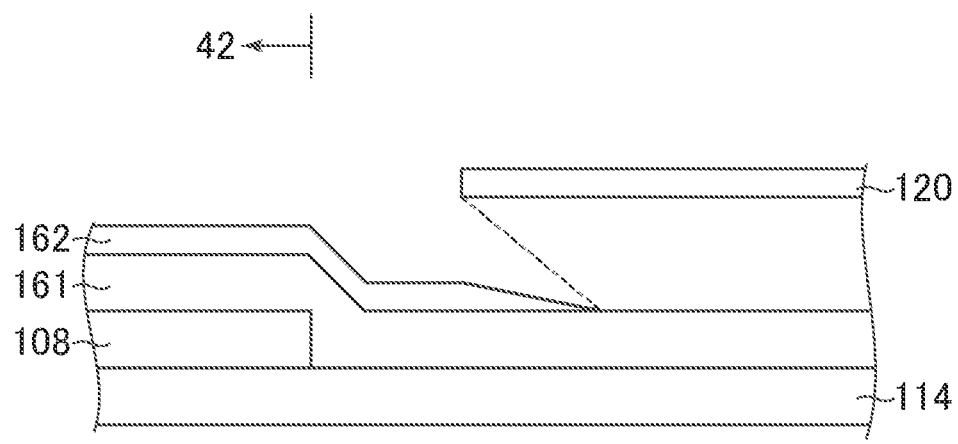
FIG. 5C is a diagram showing an example of the manufacturing process of the organic EL display device according to the embodiment.

FIG. 5C shows a process of forming the second inorganic material film 162. Unlike the first inorganic material film 161, a mask material 120 is arranged at a predetermined position so that the second inorganic material film 162 is not formed at a position where the terminal portion 118 will be formed later, and the second inorganic material film 162 is formed by the CVD method. Here, since the second inorganic material film 162 can be formed to wrap around the inside of the mask material 120 as shown in the drawing, the mask material 120 is arranged in consideration of the wraparound amount (for example, about 200 μm inside). The end portion of the second inorganic material film 162 corresponds to the inwardly wraparound portion of the mask material 120 and the upper surface thereof has a gentle slope.

Figure 5D:
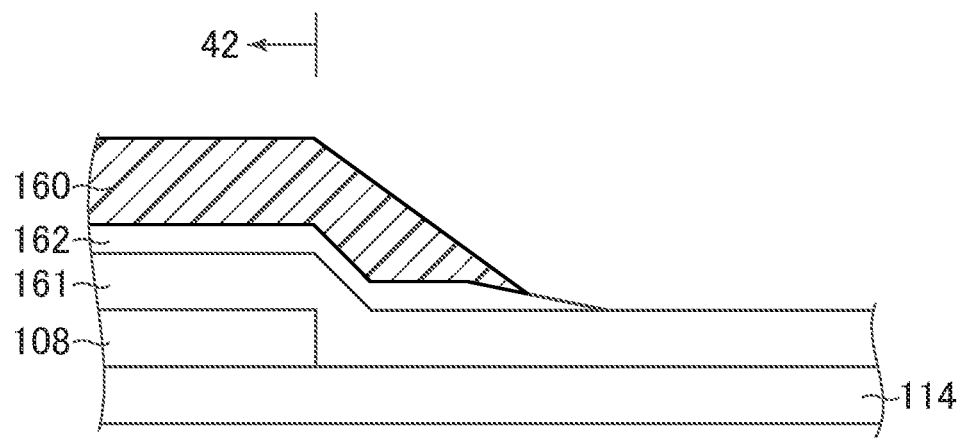
FIG. 5D is a diagram showing an example of the manufacturing process of the organic EL display device according to the embodiment.

FIG. 5D shows a process of forming the resin material layer 160. The resin material layer 160 is formed in the display region 42 and can function as a planarizing film in the display region 42. Here, the resin material layer 160 is formed such that the outer edge thereof is located closer to the display region 42 side than the outer edge of the second inorganic material film 162.

Figure 5E:
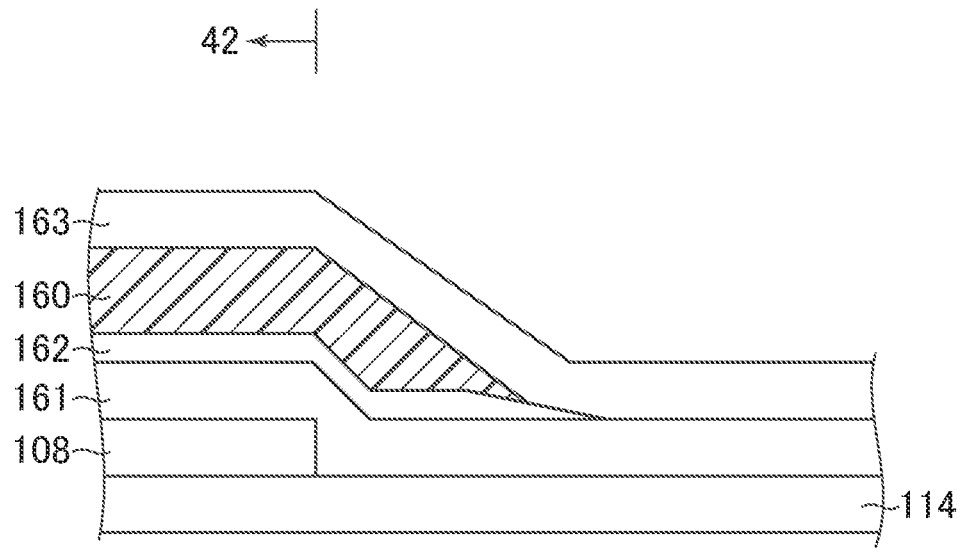
FIG. 5E is a diagram showing an example of the manufacturing process of the organic EL display device according to the embodiment.

FIG. 5E shows a process of forming the third inorganic material film 163. The third inorganic material film 163 is formed by the CVD method to cover the entire display region 42 of the substrate 114. The second inorganic material film 162 and the resin material layer 160 are sealed by the first inorganic material film 161 and the third inorganic material film 163 being in close contact with each other outside the outer edge of the second inorganic material film 162 and the resin material layer 160.

Figure 5F:
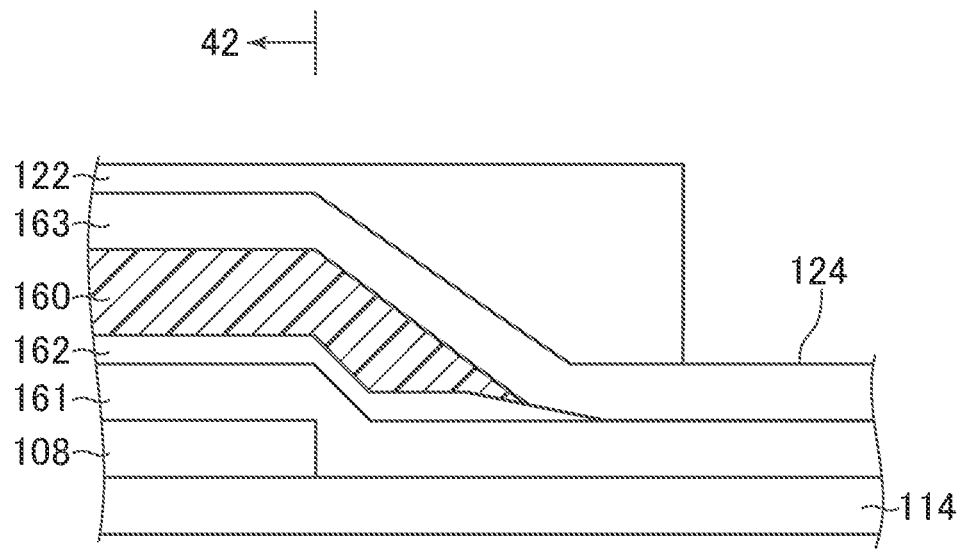
FIG. 5F is a diagram showing an example of the manufacturing process of the organic EL display device according to the embodiment.

FIG. 5F shows a process of forming a protective film 122. Here, the protective film 122 is formed to cover the display region 42, and the outer edge of the protective film 122 is located closer to the display region 42 side than the position where the terminal portion 118 is formed. The protective film 122 is formed of, for example, an organic material (typically, a resin material). Specifically, the protective film 122 is provided by pattern formation using a photosensitive resin composition, application of a resin composition by an inkjet method, attachment of a film, or the like. The protective film 122 improves the flatness in the display region 42 and is used for removing a peripheral portion 124 in the next process, for example.

Figure 5G:
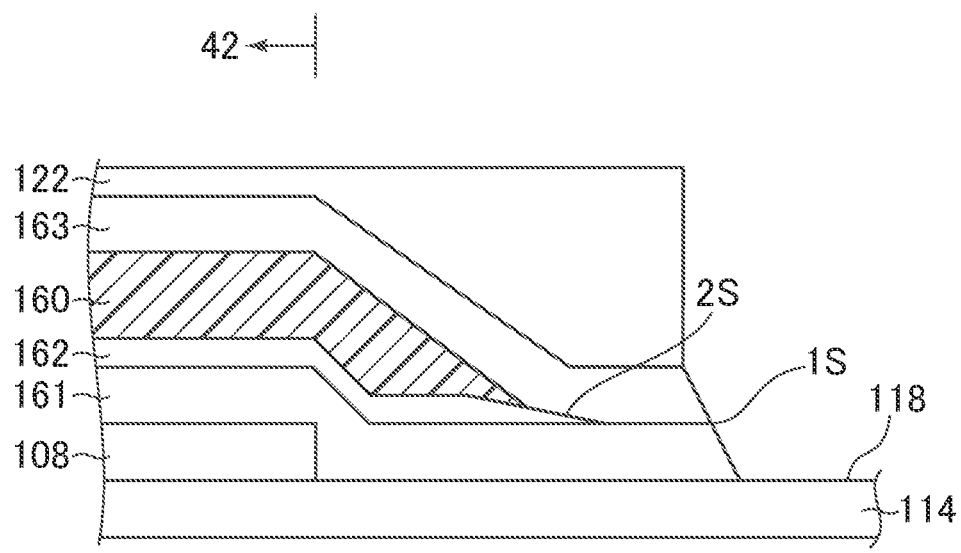
FIG. 5G is a diagram showing an example of the manufacturing process of the organic EL display device according to the embodiment.

FIG. 5G shows a process of removing the peripheral portion 124 (exposing terminals). The peripheral portion 124 is removed by etching (for example, dry etching) using the protective film 122 as a mask. The two layers of inorganic material films 161 and 163 are cut at the outer edge of the protective film 122 to form the terminal portion 118. The slope of an end surface is of the stacked portion in which the first inorganic material film 161 and the third inorganic material film 163 are stacked in direct contact is steeper than the slope of an end surface 2s of the second inorganic material film 162, for example. The protective film 122 may be removed (in the state shown in FIG. 4) after removing the peripheral portion 124 or may be left to be used as a protective layer of the display panel 40.

Figure 6:
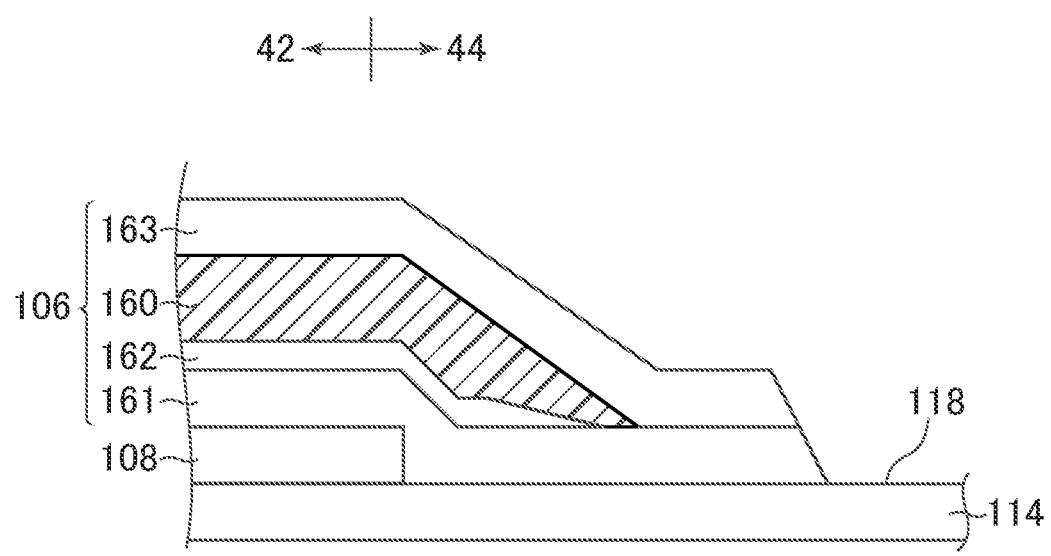
FIG. 6 is a schematic diagram showing a modification example of the cross section taken along line I-I in FIG. 2.

FIG. 6 is a schematic diagram showing a modification example of the cross section taken along line I-I in FIG. 2. Without being limited to the above embodiment, as shown in FIG. 6, the second inorganic material film 162 may be formed such that the outer edge thereof is located closer to the display region 42 side than the outer edge of the resin material layer 160. In the case of a design in which the distance between the terminal portion 118 (the region where dry etching is performed) and the display region 42 is short, the amount of inward wraparound of the mask material used when forming the above-described second inorganic material film 162 is considered, and such a form can be adopted.

The present invention is not limited to the above embodiment, and various modifications can be made. For example, a replacement can be made with a configuration that is substantially the same as the configuration shown in the above-described embodiment, a configuration that exhibits the same operational effect, or a configuration that can achieve the same object.

Within the scope of the idea of the present invention, those skilled in the art can come up with various changes and modifications and it will be understood that these changes and modifications also fall into the scope of the present invention. For example, in each of the above-described embodiments, addition, deletion or redesign of a component, or addition, omission or condition change of a process, which are appropriately made by a person skilled in the art, are also included within the scope of the present invention as long as they remain the gist of the present invention.

What is claimed is:

1. A display device comprising:
   a substrate having a display region for displaying an image;
   a plurality of pixels located in the display region of the substrate; and
   a sealing layer covering the plurality of pixels, wherein
   the sealing layer includes a first inorganic material film, a second inorganic material film, a resin material layer, and a third inorganic material film in this order from the side where the pixels are arranged, and
   the second inorganic material film is in contact with the resin material layer, has a composition different from that of the first inorganic material film, and has a higher oxygen content than the first inorganic material film,
   the first inorganic material film, the resin material layer, and the third inorganic material film cover the display region,
   a part of the first inorganic material film is located outside the display region,
   a part of the third inorganic material film is located outside the display region, and
   a stacked portion in which the first inorganic material film and the third inorganic material film are stacked in contact with each other is formed outside an outer edge of the resin material layer and an outer edge of the second inorganic material film.

2. The display device according to claim 1, wherein the slope of the end surface of the stacked portion is steeper than the slope of the end surface of the second inorganic material film.
3. The display device according to claim 1, wherein a region where the wiring included in the substrate is exposed is formed adjacent to an outer edge of the stacked portion.
4. The display device according to claim 1, wherein the first inorganic material film includes silicon nitride.
5. The display device according to claim 1, wherein the second inorganic material film includes silicon oxide.
6. The display device according to claim 1, wherein the third inorganic material film includes silicon nitride.
7. The display device according to claim 1, wherein the resin material layer includes an epoxy-based resin.
8. The display device according to claim 1, wherein the second inorganic material film covers the display region,
a part of the second inorganic material film is located outside the display region, and
the outer edge of the second inorganic material film is located outside the outer edge of the resin material layer.
9. The display device according to claim 8, wherein the slope of the end surface of the stacked portion is steeper than the slope of the end surface of the second inorganic material film.
10. The display device according to claim 8, wherein a region where the wiring included in the substrate is exposed is formed adjacent to an outer edge of the stacked portion.
11. The display device according to claim 1, wherein the second inorganic material film covers the display region,
a part of the second inorganic material film is located outside the display region, and
the outer edge of the second inorganic material film is located closer to the display region side than the outer edge of the resin material layer.
12. The display device according to claim 11, wherein the slope of the end surface of the stacked portion is steeper than the slope of the end surface of the second inorganic material film.
13. The display device according to claim 11, wherein a region where the wiring included in the substrate is exposed is formed adjacent to an outer edge of the stacked portion.

* * * * *